United States Patent
Dorosenco et al.

(10) Patent No.: US 10,931,498 B1
(45) Date of Patent: Feb. 23, 2021

(54) PHASE SYNCHRONIZATION FOR ROUND TRIP DELAY ESTIMATION

(71) Applicant: QUALCOMM Incorporated, San Diego, CA (US)

(72) Inventors: Alexander Dorosenco, El Cajon, CA (US); Carl Hardin, Encinitas, CA (US); Joseph Patrick Burke, San Diego, CA (US); Joseph Binamira Soriaga, San Diego, CA (US); Jay King, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/683,162

(22) Filed: Nov. 13, 2019

Related U.S. Application Data

(60) Provisional application No. 62/884,634, filed on Aug. 8, 2019.

(51) Int. Cl.
*H04L 27/26* (2006.01)
*H03L 7/085* (2006.01)
*H04W 56/00* (2009.01)

(52) U.S. Cl.
CPC .......... *H04L 27/2657* (2013.01); *H03L 7/085* (2013.01); *H04L 27/2656* (2013.01); *H04L 27/2672* (2013.01); *H04L 27/2676* (2013.01); *H04W 56/0015* (2013.01); *H04W 56/0045* (2013.01)

(58) Field of Classification Search
CPC ........ H04B 1/403; H04B 1/408; H04L 7/0331
See application file for complete search history.

(56) References Cited

U.S. PATENT DOCUMENTS

| | | | |
|---|---|---|---|
| 5,794,119 A * | 8/1998 | Evans | H04N 7/173 455/3.05 |
| 9,225,507 B1 | 12/2015 | Lye et al. | |
| 9,531,323 B1 * | 12/2016 | Khalili | H03B 5/364 |
| 2009/0156149 A1 * | 6/2009 | Plevridis | H03L 7/23 455/260 |

(Continued)

FOREIGN PATENT DOCUMENTS

WO    WO-2016209474 A1    12/2016

OTHER PUBLICATIONS

Partial International Search Report—PCT/US2020/041233—ISA/EPO—dated Sep. 30, 2020.

*Primary Examiner* — Kevin Kim
(74) *Attorney, Agent, or Firm* — Thien T. Nguyen

(57) ABSTRACT

Phase variations between a transmitter (TX) waveform and a receiver (RX) waveform produced by a TX Phase-Locked-Loop (PLL) and a RX PLL, respectively, is a source of error in processing delay calibration used, e.g., in Round Trip Time (RTT) estimation. While a TX waveform and a RX waveform have a constant phase delay while in steady state conditions, during transient times, e.g., at start up or reset, the phase delay may vary by as much as ±180°, which at baseband frequencies of 50 MHz, introduces a random delay variations of as much as ±10 nsec, which is undesirable for fine position estimation using RTT. The phase delay variation between the TX waveform and RX waveform may be reduced or eliminated using a phase correction signal generated using the output signals of the TX PLL and RX PLL.

24 Claims, 7 Drawing Sheets

(56) References Cited

U.S. PATENT DOCUMENTS

| | | | |
|---|---|---|---|
| 2009/0213974 A1* | 8/2009 | Haralabidis | H04B 15/04 375/376 |
| 2009/0253382 A1* | 10/2009 | Haralabidis | H04B 1/406 455/73 |
| 2012/0025881 A1 | 2/2012 | Ding et al. | |
| 2013/0208839 A1* | 8/2013 | Isberg | H04L 7/0016 375/371 |
| 2014/0062537 A1 | 3/2014 | Kitsukawa et al. | |
| 2018/0102783 A1* | 4/2018 | Sjoland | H03L 7/23 |
| 2019/0324118 A1* | 10/2019 | Storz | G01S 7/03 |

* cited by examiner

PHASE SYNCHRONIZATION FOR ROUND TRIP DELAY ESTIMATION

CROSS-REFERENCE TO RELATED APPLICATIONS

This application claims the benefit of U.S. Provisional Application No. 62/884,634, entitled PHASE SYNCHRONIZATION FOR ROUND TRIP DELAY ESTIMATION," filed Aug. 8, 2019, which is assigned to the assignee thereof and which is expressly incorporated herein by reference in its entirety.

BACKGROUND

Wireless communication systems have developed through various generations, including a first-generation analog wireless phone service (1G), a second-generation (2G) digital wireless phone service (including interim 2.5G and 2.75G networks), a third-generation (3G) high speed data, Internet-capable wireless service and a fourth-generation (4G) service (e.g., LTE or WiMax). A fifth generation (5G) mobile standard calls for higher data transfer speeds, greater numbers of connections, and better coverage, among other improvements. The 5G standard, according to the Next Generation Mobile Networks Alliance, is designed to provide data rates of several tens of megabits per second to each of tens of thousands of users, with 1 gigabit per second to tens of workers on an office floor.

Obtaining the location of a mobile device that is accessing a wireless (e.g. 5G) network may be useful for many applications including, for example, emergency calls, personal navigation, asset tracking, locating a friend or family member, etc. One type of positioning method is round-trip-time (RTT), which is the length of time it takes for a signal to be sent from one entity to another, e.g., from a base station to a user equipment (UE) or vice versa, plus the length of time it takes for a return signal, e.g., an acknowledgement of that signal, to be received. The time delay includes the propagation times for the paths between the two communication endpoints, which is proportional to the distance between the two communication endpoints. The time delay further includes processing delays within an endpoint, e.g., to receive, process, and respond to a signal. The processing delays are calibrated out of the RTT measurement in order to obtain an accurate position measurement. It is desirable to improve the calibration of processing delay in order to achieve more accurate position estimations.

SUMMARY

Phase delay variation between a transmitter (TX) waveform and a receiver (RX) waveform produced by a TX phase-locked-loop (PLL) and RX PLL, respectively, is a source of error in processing delay calibration used, e.g., in positioning procedures such as RTT) measurement. While a TX PLL and RX PLL have a constant phase relationship while in steady state conditions, during transient times, e.g., at start up or reset, the phase relationship between the TX PLL and RX PLL is uncertain, which at baseband waveform frequencies of 50 MHz, can introduce a random delay variation of as much as ±10 nsec, which is undesirable for fine position estimation using RTT. The phase delay variation between the TX waveform and RX waveform may be reduced or eliminated by using a phase correction signal generated using the output signals of the TX PLL and RX PLL.

In one implementation, an entity in a wireless network, the entity being one of a mobile device or base station, includes a transmitter (TX) phase-locked loop (PLL) configured to receive a first clock signal from a reference clock and generate a (TX) waveform; a receiver (RX) phase-locked loop (PLL) configured to receive a second clock signal from the reference clock and generate a RX waveform; wherein one or both of the transmitter PLL and the receiver PLL is configured to receive a phase correction signal and to adjust a phase relationship between the TX waveform and the RX waveform based on the phase correction signal so that the TX waveform and the RX waveform have a same phase relationship each time the transmitter PLL and the receiver PLL achieve a steady-state condition.

In one implementation, a method of calibration of an entity in a wireless network, the entity being one of a mobile device or base station, includes providing a first clock signal from a reference clock to a transmitter (TX) phase-locked loop (PLL) that generates a TX waveform; providing a second clock signal from the reference clock to a receiver (RX) PLL that generates a RX waveform; generating a phase correction signal that is received by the transmitter PLL and the receiver PLL; and adjusting a phase relationship between the TX waveform and the RX waveform based on the phase correction signal so that the TX waveform and the RX waveform signal have a same phase relationship each time the transmitter PLL and the receiver PLL achieve a steady-state condition.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION

Round-Trip-Time (RTT) positioning of a user equipment (UE) uses two-way time-of-arrival measurements, to determine an estimated distance between the UE and a base station. These measurements include processing delays within an endpoint, e.g., to receive, process, and respond to a signal. For an accurate estimation of position, the processing delays are calibrated and removed from an RTT measurement. Disclosed are techniques for calibration of processing delays and in particular for delays that are due to hardware within the UE or base station.

These techniques and other aspects are disclosed in the following description and related drawings directed to specific aspects of the disclosure. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage or mode of operation.

A mobile device, also referred to herein as a UE, may be mobile or may (e.g., at certain times) be stationary, and may communicate with a radio access network (RAN). As used herein, the term "UE" may be referred to interchangeably as an "access terminal" or "AT," a "client device," a "wireless device," a "subscriber device," a "subscriber terminal," a "subscriber station," a "user terminal" or UT, a "mobile terminal," a "mobile station," or variations thereof. Generally, UEs can communicate with a core network via a RAN, and through the core network the UEs can be connected with external networks such as the Internet and with other UEs. Of course, other mechanisms of connecting to the core network and/or the Internet are also possible for the UEs, such as over wired access networks, WiFi networks (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

Figure 1:
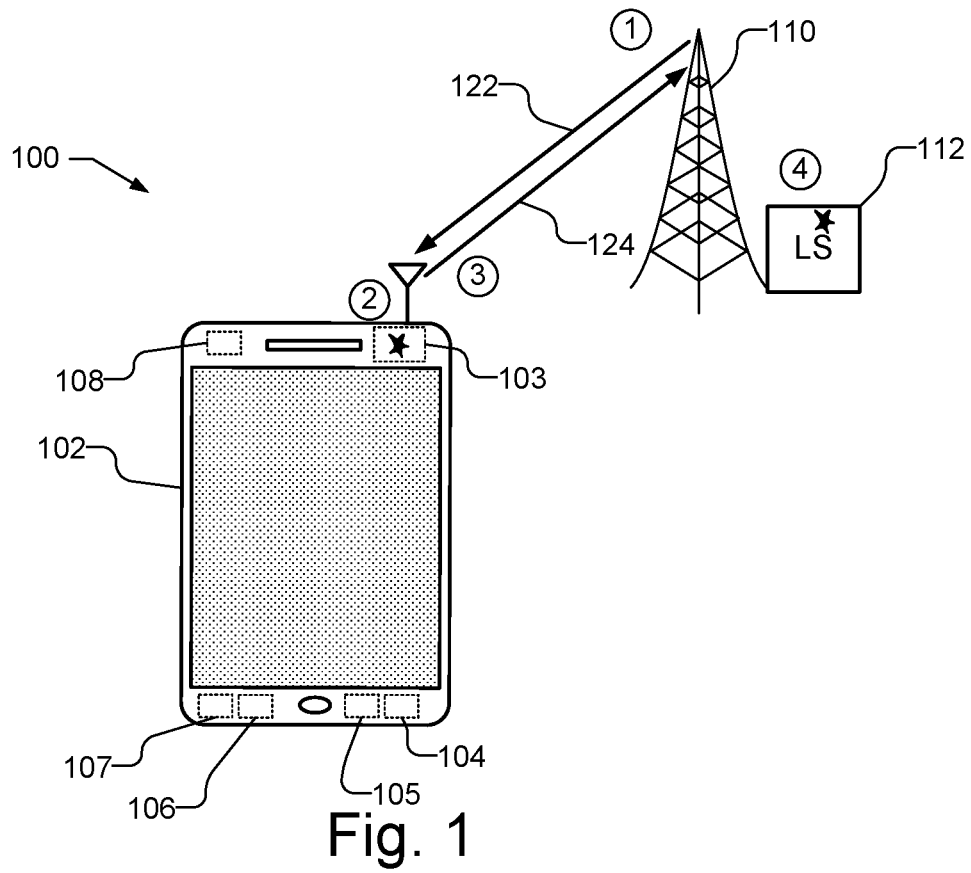
FIG. 1 illustrates a simplified environment and an exemplary technique for determining Round Trip Time (RTT) between a user equipment and a base station.

FIG. 1 illustrates a simplified environment 100 and an exemplary technique for determining Round Trip Time (RTT) between a UE 102 and a base station 110. The UE 102 may communicate wirelessly with a base station, 110 using radio frequency (RF) signals and standardized protocols for the modulation of the RF signals and the exchanging of information packets. By extracting different types of information from the exchanged signals, and utilizing the layout of the network (i.e., the network geometry including additional base stations (not shown)), the position of the UE 102 may be determined in a predefined reference coordinate system. For example, the determined RTT between the UE 102 and the base station 110 is proportional to the distance between the two communication endpoints. Using a known position of the base station 110, the position of the UE 102 may be determined to be on a circle (or sphere) around the base station 110. With similar measurements to multiple base stations having known positions, the position of the UE 102 may be determined based on the point of intersection of the circles (or spheres).

As illustrated, at a stage 1 of determining the RTT between the UE 102 and the base station 110, the base station 110 may transmit an RTT measurement signal (or message) 122 to the UE 102. At stage 2, a processor 103 in the UE 102 receives the RTT measurement signal 122 and processes the signal to determine that a response message is to be returned. At stage 3, the UE 102 transmits a RTT response signal (or message) 124 to the base station 110. The total time between transmitting the RTT measurement signal 122 and receiving the RTT response signal 124 is the measured round trip time, i.e., the RTT measurement. At stage 4, a location server 112 may receive the RTT measurement based on the time between transmitting the RTT measurement signal 122 and receiving the RTT response signal 124 from the base station 110 and may use the RTT measurement to determine an estimated distance between the UE 102 and the base station 110. The location server 112 may use similar RTT measurements for the UE 102 from a number of base stations to then determine an estimated position of the UE using known geometric techniques, such as trilateration.

The UE 102 may comprise and/or be referred to as a device, a mobile device, a wireless device, a mobile terminal, a terminal, a mobile station (MS), a Secure User Plane Location (SUPL) Enabled Terminal (SET), or by some other name. Moreover, UE 102 may correspond to a cellphone, smartphone, laptop, tablet, PDA, tracking device, navigation device, Internet of Things (IoT) device, or some other portable or moveable device. Typically, though not necessarily, the UE 102 may support wireless communication using one or more Radio Access Technologies (RATs) such as using Global System for Mobile communication (GSM), Code Division Multiple Access (CDMA), Wideband CDMA (WCDMA), LTE, High Rate Packet Data (HRPD), IEEE 802.11 WiFi (also referred to as Wi-Fi), Bluetooth® (BT), Worldwide Interoperability for Microwave Access (WiMAX), 5G New Radio (NR), etc. The UE 102 may also support wireless communication using a Wireless Local Area Network (WLAN) which may connect to other networks (e.g. the Internet) using a Digital Subscriber Line (DSL) or packet cable for example The use of one or more of these RATs may allow the UE 102 to communicate with an external client and/or allow the external client to receive location information regarding the UE 102.

An estimate of a location of the UE 102 may be referred to as a location, location estimate, location fix, fix, position, position estimate or position fix, and may be geographic, thus providing location coordinates for the UE 102 (e.g., latitude and longitude) which may or may not include an altitude component (e.g., height above sea level, height above or depth below ground level, floor level or basement level). Alternatively, a location of the UE 102 may be expressed as a civic location (e.g., as a postal address or the designation of some point or small area in a building such as a particular room or floor). A location of the UE 102 may also be expressed as an area or volume (defined either geographically or in civic form) within which the UE 102 is expected to be located with some probability or confidence level (e.g., 67%, 95%, etc.) A location of the UE 102 may further be a relative location comprising, for example, a distance and direction or relative X, Y (and Z) coordinates defined relative to some origin at a known location which may be defined geographically, in civic terms, or by reference to a point, area, or volume indicated on a map, floor plan or building plan. In the description contained herein, the use of the term location may comprise any of these variants unless indicated otherwise. When computing the location of a UE, it is common to solve for local x, y, and possibly z coordinates and then, if needed, convert the local coordinates into absolute ones (e.g. for latitude, longitude and altitude above or below mean sea level).

The base station 110 may be part of a Fifth Generation (5G) network comprising a Next Generation (NG) Radio Access Network (RAN) (NG-RAN) and a 5G Core Network (5GC). A 5G network may also be referred to as a New Radio (NR) network; NG-RAN may be referred to as a 5G RAN or as an NR RAN; and 5GC may be referred to as an NG Core network (NGC). Standardization of an NG-RAN and 5GC is ongoing in the Third Generation Partnership Project (3GPP). The base station 110 may be referred to as a NR NodeB, also referred to as a gNB. The base station 110 may be part of other types of networks, such as 3G, Long Term Evolution (LTE), etc, and may be referred to as a Node B, evolved NodeB, eNodeB, etc.

During the RTT measurement process, various hardware elements within the UE 102 are necessary to receive and transmit signals for the RTT measurement. For example, the UE 102 includes a receiver (RX) phase-locked loop (PLL) 104 and a transmitter (TX) PLL 105, a receiver (RX) Analog-to-Digital Converter (ADC) 106 and a transmitter (TX) Digital-to-Analog Converter (DAC) 107. The UE 102 further includes one or more reference clocks 108, as well as other necessary hardware elements as discussed that may be used to ensure proper calibration of any hardware delays during an RTT measurement. The base station 110 may include the same or similar components in order to receive and transmit signals for the RTT measurement.

It should be understood that while FIG. 1 provides one general illustrative process for an RTT measurement, RTT measurements may be produced using other similar processes that are well understood in the art. For example, the base station 110 itself may determine the estimated distance to the UE 102 using the RTT measurement and may provide the estimated distance to the location server 112 as opposed to the RTT measurement. Further, the UE 102, as opposed to the base station 110, may determine the RTT measurement, e.g., the UE 102 would transmit the RTT measurement signal 122 at stage 1 and receive the RTT response signal 124 from the base station 110 at stag 3. The UE 102 may determine the estimated distance between the UE 102 and the base station 110 using the RTT measurement and may determine the estimated position of the UE 102. Alternatively, the UE 102 may communicate with location server 112 and location server may determine estimated distance and/or estimated position of the UE 102.

Determining the distance between the UE 102 and a base station 110 involves exploiting time information of the radio frequency (RF) signals between the two. For example, assuming there is no delay at stage 3, i.e., no delay between receiving the RTT measurement signal 122 at stage 1 and transmitting the RTT response signal 124, the total time between sending the signal and receiving the acknowledgement is related to the time of travel of the signals and, assuming the signals are line of sight (LOS), can be easily converted to the distance between the entities by multiplying by the signal speed, i.e., the speed of light. In practice, however, processing delays exist in both the UE 102 and the base station 110, which affect the RTT measurement. Through calibration, the processing delay may be determined and removed from the RTT measurement in order to more accurately estimate the position of the UE.

Figure 2:
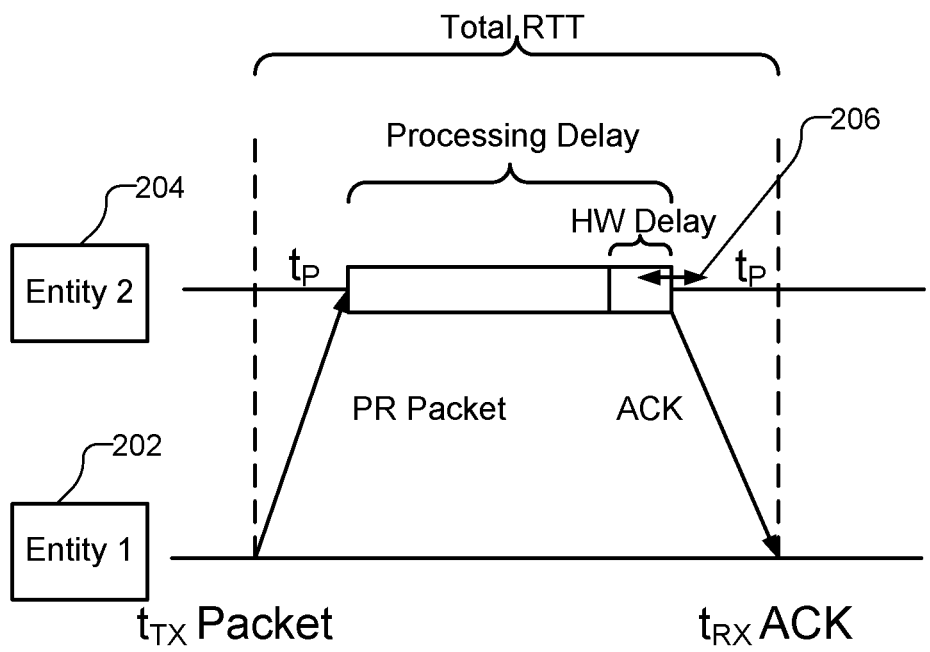
FIG. 2 is a diagram showing exemplary timings within an RTT measurement occurring during a wireless probe request and a response initiated by a first entity and received by a second entity.

FIG. 2 is a diagram showing exemplary timings within an RTT measurement that occur during a wireless probe request and a response initiated by a first entity 202 and received by a second entity 204. By way of example, the first entity 202 may be a base station, such as base station 110, and the second entity 204 may be a UE, such as UE 102, but if desired, the first entity 202 may be the UE and the second entity 204 may be the base station. In an aspect, the RTT response may take the form of an acknowledgement packet (ACK); however, any type of response packet may be used.

As illustrated, to measure the RTT with respect to the second entity 204, the first entity 202 may send a directed probe request, e.g., a downlink RTT reference signal, to the second entity 204, and record the time (timestamp) the probe request packet was sent ($t_{TX}$ Packet) as shown on the first entity 202 timeline. After a propagation time $t_p$ from the first entity 202 to the second entity 204, the second entity 204 will receive the packet. The second entity 204 may then process the directed probe request and may send an acknowledgement (ACK), e.g., an uplink RTT reference signal, back to the first entity 202 after some processing time, e.g., the processing delay, as shown on the second entity 204 timeline. After a second propagation time $t_p$, the first entity 202 may record the time (timestamp) the ACK packet was received ($t_{RX}$ ACK) as shown on the first entity 202 time line. It should be understood that there may also be some processing delay in the first entity 202 between receiving the ACK packet and timestamping the ACK packet. The first entity 202, or other entity such as the second entity 204 or location server, may determine the total RTT as the time difference $t_{RX}$ACK−$t_{TX}$Packet. The net RTT, i.e., the two-way propagation time ($2*t_p$), may be determined based on the difference between the total RTT and the processing delay. Thus, it is important to calibrate the processing delay.

As illustrated in FIG. 2, the processing delay includes delays caused by hardware (HW) within the second entity 204. Moreover, as illustrated by the arrow 206, the amount of delay caused by hardware may be variable. The first entity 202 similarly suffers from processing delays caused by hardware. Currently, position estimation based on round trip time is coarse enough that any variation in hardware delays is considered negligible. However, if more accurate position estimation is desired, e.g., as is being considered under 5G mobile standards based on wideband waveforms at mmWave carrier frequencies such as FR2, FR4, etc., then the variation in hardware delays, e.g., in both the second entity 204 and the first entity 202, is no longer negligible and must be properly calibrated or controlled. For example, the position estimation requirements currently being considered under the 5G Rel 17 3GPP standard leads to a hardware calibration procedure that estimates electrical delays below 1 nsec.

One cause of variation in the hardware delay is due to a lack of synchronization between the RX PLL 104 and the TX PLL 105, shown in FIG. 1, which control the timing of the reception and transmission of signals by the UE 102 (or similar components that control the timing of the reception and transmission of signals in the base station 110).

Figure 3:
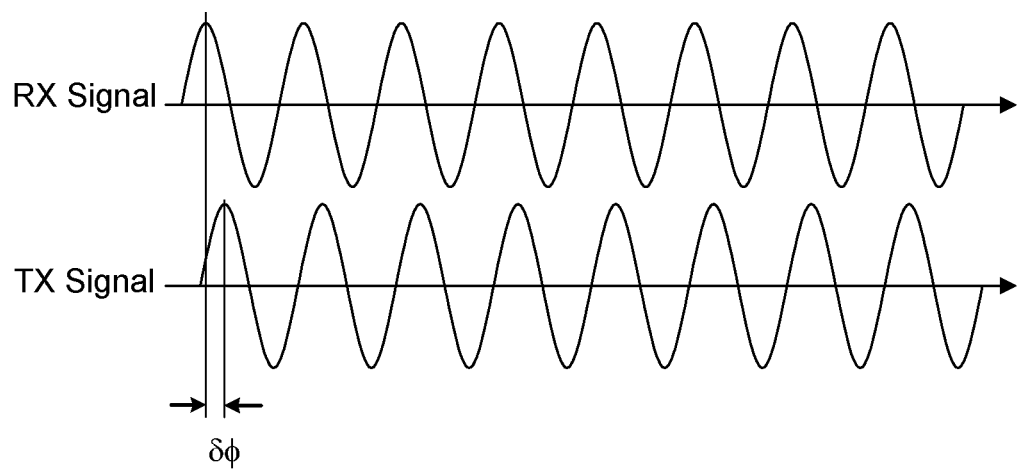
FIG. 3 is a timing diagram illustrating RX and TX baseband signals produced by a receiver (RX) Phase-Locked-Loop (PLL) and a transmitter (TX) PLL after they have achieved a steady-state condition.

FIG. 3, by way of example, is a timing diagram illustrating RX and TX baseband signals produced by the RX PLL 104 and the TX PLL 105, respectively. The RX and TX baseband signals are illustrated as having the same frequencies, but it should be understood, however, that they may have different frequencies. Once the RX PLL and TX PLL are in a steady-state condition, the RX baseband waveform and the TX baseband waveforms have a fixed phase relationship. For example, RX baseband signals, i.e., RX waveforms, and TX baseband signals, i.e., TX waveforms, may be described as follows.

$$RX\_Signal = a(t) * e^{i\theta_{RX}(t) + i\varphi_{RX}} \qquad \text{eq. 1}$$

$$TX\_Signal = b(t) * e^{i\theta_{TX}(t) + i\varphi_{TX}} \qquad \text{eq. 1}$$

The phase difference $\delta\varphi$ between the RX signal and the TX signal is the difference $\varphi_{RX} - \varphi_{TX}$. This phase difference $\delta\varphi$ causes the reception and transmission clocks to be misaligned, and is therefore one source of the hardware delay in the UE 102 and in the base station 110 during an RTT measurement process.

The phase difference $\delta\varphi$ between the TX waveform and the RX waveform will remain constant as long as the RX PLL and the TX PLL remain in a steady state condition. However, during a transient time of the RX PLL, the TX PLL, or both, the phase difference $\delta\varphi$ does not remain constant and may change by as much as ±180° until the steady state condition of the PLLs occurs, which locks the resulting phase difference $\delta\varphi$ between the TX waveform and the RX waveform until the next transient time occurs. At baseband frequencies of 50 MHz, such uncertainty can introduce random delay variations by as much as ±10 nsec. Anytime one or more of the RX PLL and the TX PLL undergo a transient time, e.g., at start up or a reset, the phase difference $\delta\varphi$ between the baseband waveforms will change. Accordingly, the hardware delay caused by phase difference $\delta\varphi$ between the TX waveform and the RX waveform is variable and is a source of error in the processing delay calibration.

Thus, in order to accurately determine and remove the processing delay in an RTT measurement, phase calibration of the RX PLL and TX PLL is desirable in order to address the variable phase difference $\delta\varphi$ between the RX waveform and the TX waveform.

Another source of hardware delay during an RTT measurement is due to the lack of synchronization between the RX ADC 106 and TX DAC 107, shown in FIG. 1. The lack of synchronization between the RX ADC 106 and TX DAC 107 results in cycle slip errors. In order to accurately determine and remove the processing delay in an RTT measurement, it is desirable to address the lack of synchronization between the RX ADC 106 and TX DAC 107 (or similar components in the base station 110).

Figure 4:
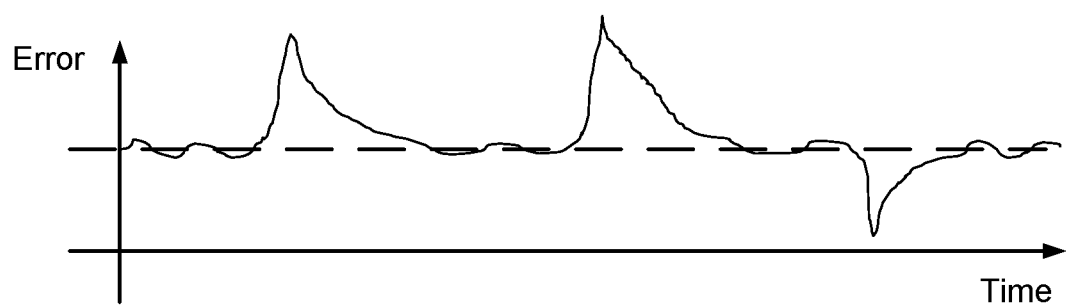
FIG. 4 is a graph illustrating cycle slip errors that may occur due to lack of synchronization between an RX Analog-to-Digital Converter (ADC) and a TX Digital-to-Analog Converter (DAC).

FIG. 4, by way of example, is a graph illustrating cycle slip errors that may occur due to lack of synchronization between the RX ADC 106 and TX DAC 107 shown in FIG. 1. Cycle slip between RX ADC 106 and TX DAC 107 is due to these systems running asynchronously at irrational sampling clock ratios. For example, for every N clock cycles of RX ADC 106 there may be M clock cycles of TX DAC 107. Due to frequency drifts and irrational clock ratios, from time to time there will be M+1 cycles or M−1 cycles of TX DAC 107 for every N cycles of RX ADC 106, resulting in a cycle slip error that will produce location positioning errors.

Figure 5:
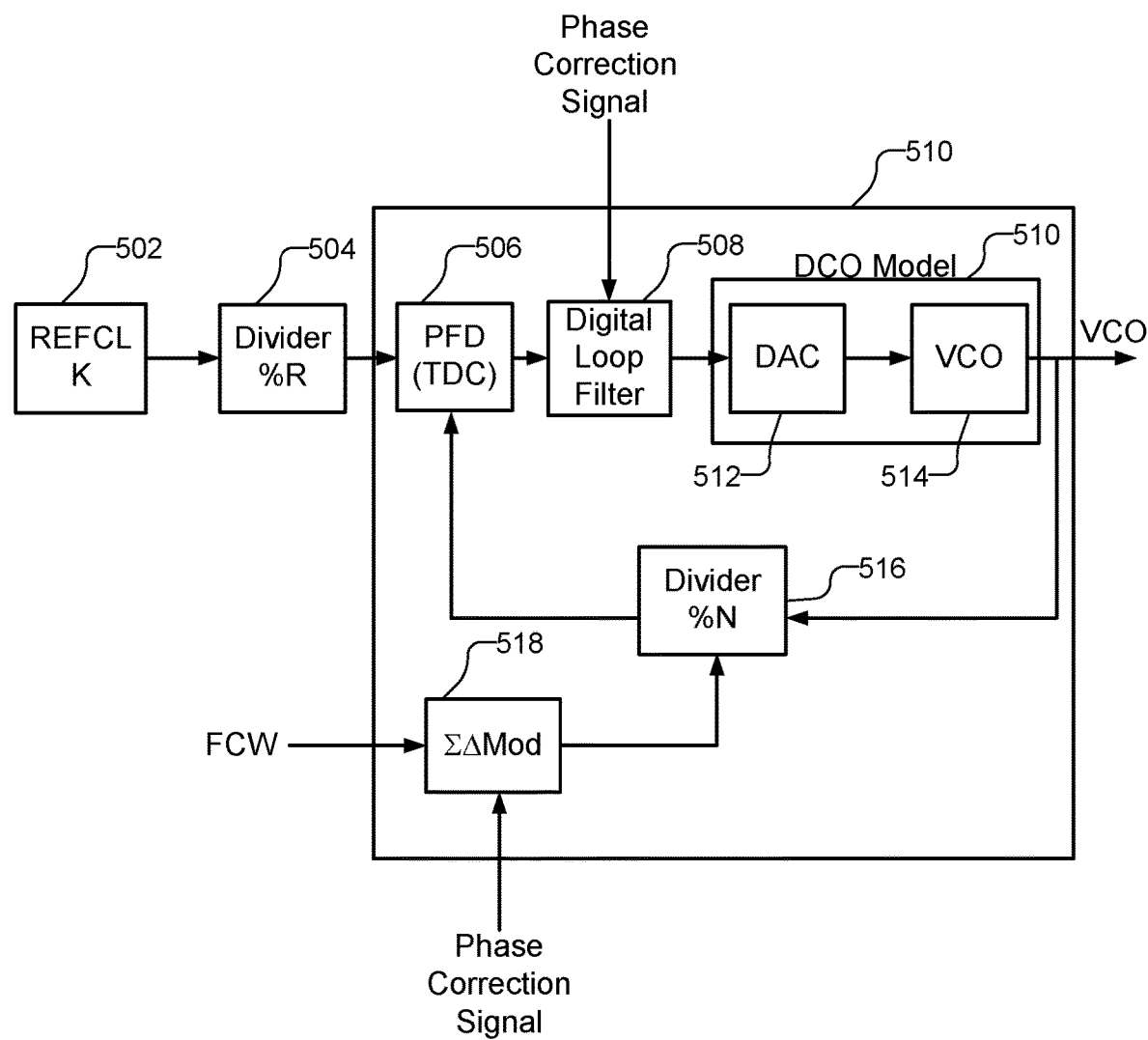
FIG. 5 is a diagram illustrating a PLL that receives a phase correction signal.

FIG. 5 is a diagram illustrating a PLL 500, which may be the RX PLL 104 or TX PLL 105 shown in the UE 102 in FIG. 1, or may be a similar RX PLL or TX PLL in the base station 110 in FIG. 1. The PLL 500 receives a clock signal from a reference clock (REFCLK) 502, which may be digital controlled crystal oscillator (DCXO). The clock signal is divided by a reference divider 504. The PLL 500 includes a phase frequency detector (PFD) 506, which may be a time to digital converter (TDC). The PFD 506 also receives a feedback signal from the feedback divider 516 and provides an output signal that represents the time interval, e.g., the error, between the reference clock and the feedback signal. A digital loop filter 508, which may operate as a low pass filter, receives the output signal from the PFD 506. The output of the digital loop filter 508 is received by a Digitally Controlled Oscillator (DCO) model 510 circuit, which is illustrated as including a Digital-to-Analog converter (DAC) 512 and a Voltage-Controlled-Oscillator (VCO) 514, which produces an output signal VCO. The output signal VCO from the DCO model 510 is also divided by the feedback divider 516 and provided to the PFD 506 in the feedback loop. Feedback divider 516 may be controlled by a $\Sigma\Delta$ modulator 518 in response to a frequency control word (FCW).

Digital and fractional PLLs use various divider ratios, e.g., in reference divider 504 and feedback divider 516, in order to select the desired output frequency. The divider ratios are programmable and are sometimes driven by $\Sigma\Delta$ modulators, such as $\Sigma\Delta$ modulator 518, in order to provide fine frequency resolution. It is not practical, however, to calibrate the phase delays for all channel center frequencies and loop filter bandwidths for the PLL. Thus, a single point calibration is desirable. Phase synchronization between multiple PLLS may be used to achieve a phase difference $\delta\varphi$ that is constant and does not vary even after transient times, e.g., at start up or reset.

Most signal delays within a digital PLL, such as PLL 500, are predictable and not subject to uncertainty or variation, during a transient time, such as in a power up state. For example, the PFD 506 outputs a signal with a phase that is always aligned to the received reference clock. The filter delay from the digital loop filter 508 is fixed and predictable. The phase delay produced by the feedback divider 516 varies with the divider ratio, which is known. The phase delay from the DCO model 510, however, varies with the initial state of the DAC 512, and is therefore a source of the uncertainty in the signal delay of the PLL.

As illustrated in FIG. 5, a phase correction signal may be provided to the digital loop filter 508 and/or the $\Sigma\Delta$ modulator 518. The phase correction signal may be used to ensure that the phase of the output VCO produced by PLL 500 is constant with respect to the output VCO produced by another PLL. The phase correction signal changes the response of the digital loop filter 508 to introduce a delay as needed. The delay may be introduced, for example, by recalculating the digital loop filter's coefficients or by switching on/off additional time delays. If the phase correction signal is provided to the $\Sigma\Delta$ modulator 518, the phase correction signal may cause the $\Sigma\Delta$ modulator 518 to adjust the feedback divider 516 to introduce a delay as needed.

Figure 6:
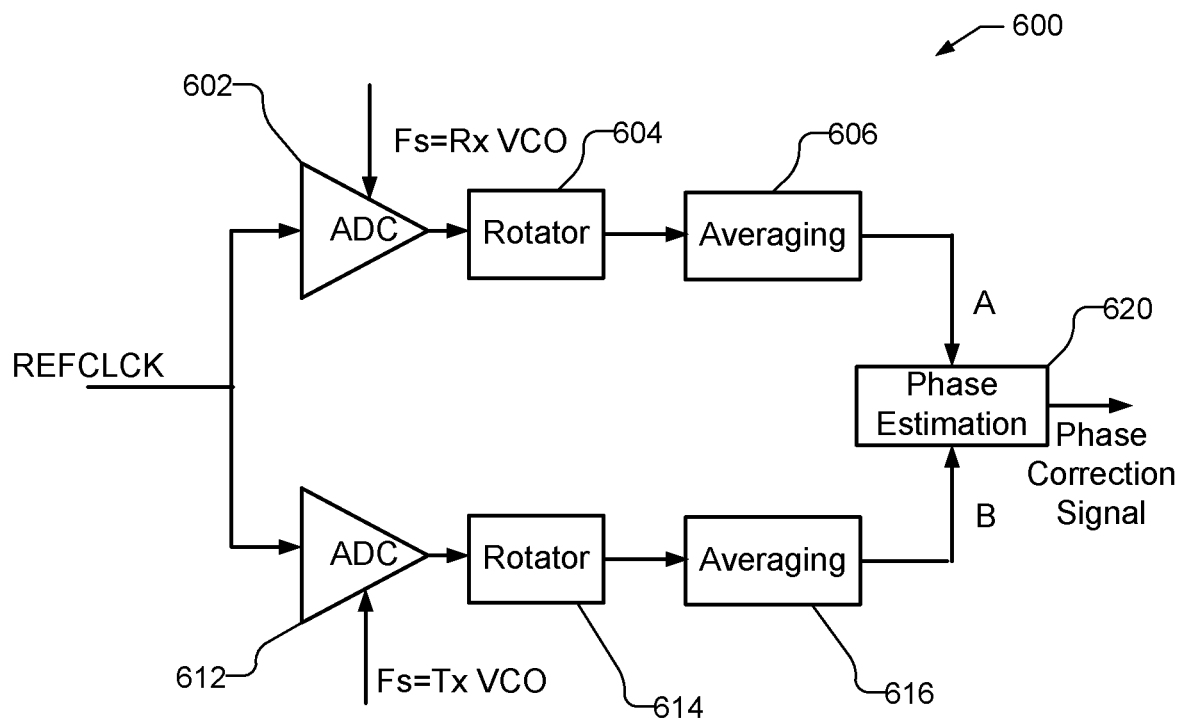
FIG. 6 is a diagram illustrating generation of the phase correction signal based on output signals from the RX PLL and TX PLL and the reference clock.

FIG. 6 is a diagram illustrating a phase match estimation circuit 600 that generates a phase correction signal to be provided to the RX PLL and TX PLL in the UE 102 or in the base station 110. The phase match estimation circuit 600 determines the phase/time delay between two sampled versions of the reference clock, e.g., the reference clock is sampled simultaneously by the RX PLL and the TX PLL, and a single point Discrete Fourier Transform (DFT) is calculated.

As illustrated, in a first arm, a first differential ADC driver 602 receives the reference clock signal as well as a frequency sampling (Fs) from the output signal VCO from the RX PLL. A rotator circuit 604 rotates the output signal from the differential ADC driver 602, which is then averaged with averaging circuit 606. The resulting signal is provided to the phase estimation circuit 620 as input A. The phase match estimation circuit 600 may use the Fast Fourier Transform (FFT) to calculate the DFT of the sampled reference clock. The important FFT bin is located at the reference clock frequency. By rotating the data with rotator circuit 604, the bin of interest is moved down to DC. The averaging circuit 606 calculates a windowed average of the amplitude and phase of the sampled reference clock in frequency domain. The phase information captures the phase delay of the sampling clock for an ADC (not shown) in the phase estimation circuit 620. Similarly, in a second arm, a second differential ADC driver 612 receives the reference clock signal as well as a frequency sampling (Fs) from the output signal VCO from the TX PLL. A rotator circuit 614 rotates the output signal from the differential ADC driver 612, which is then averaged with averaging circuit 616. The resulting signal is provided to the phase estimation circuit 620 as input B. The phase estimation circuit 620 receives inputs A and B and performs a complex number division to calculate the phase difference between the two inputs, A and B. The phase difference information is then used to calculate the phase correction signals to be sent to the two PLLs. The phase correction signal, for example, may be derived from the phase difference by calculating the group delay needed to be applied to the PLL's digital loop filter 508 or the time delay required to be applied to the digital dividers, e.g., at the ΣΔ modulator 518 and the feedback divider 516.

Figure 7:
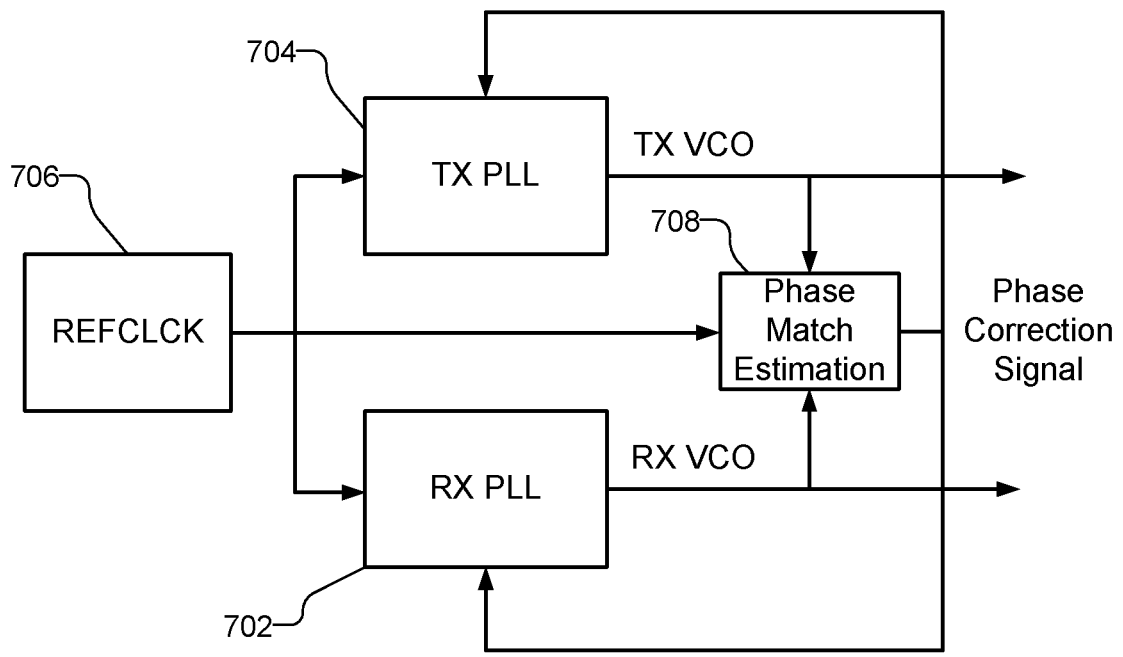
FIG. 7 illustrates a block diagram illustrating the phase delay correction in a RX PLL and TX PLL using the phase correction signal.

FIG. 7 illustrates a block diagram illustrating the phase delay correction in a RX PLL 702 and TX PLL 704, which may be in a UE, such as UE 102, or a base station, such as base station 110. As illustrated, a reference clock 706 provides a reference clock signal to the RX PLL 702 and TX PLL 704, as well as the phase match estimation circuit 708. The RX PLL 702 and TX PLL 704 may be similar to PLL 500 shown in FIG. 5. One or both of the RX PLL 702 and the TX PLL 704 may receive a phase correction signal from the phase match estimation circuit 708 and adjust a phase relationship between the TX waveform (TX VCO) and the RX waveform (RX VCO) based on the phase correction signal so that the TX waveform and the RX waveform have a same phase relationship each time the transmitter PLL and the receiver PLL achieve a steady-state condition. FIG. 7 illustrates both RX PLL 702 and the TX PLL 704 receiving the phase correction signal and producing RX VCO and TX VCO signals, respectively. The phase match estimation circuit 708 may be similar to the phase match estimation circuit 600 shown in FIG. 6 and in addition to receiving the reference clock signal, may receive the RX VCO and TX VCO signals and produce a phase correction signal as discussed herein.

With the use of the phase match estimation circuit 708, the RX VCO and TX VCO signals produced by RX PLL 702 and TX PLL 704 guarantee to have a phase difference δφ between the TX waveform and the RX waveform that is constant and does not vary even after transient times, e.g., at start up or reset, of one or both of the RX PLL 702 and TX PLL 704.

Figure 8:
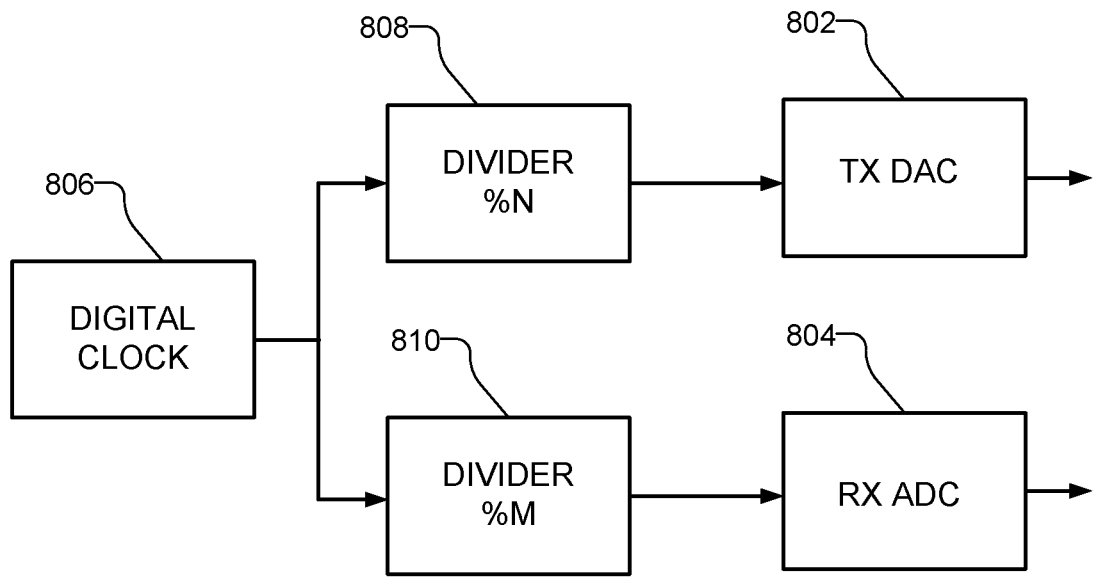
FIG. 8 is a block diagram illustrating synchronization between a TX DAC and a RX ADC using a clock signal from digital reference sampling clock.

FIG. 8 is a block diagram illustrating synchronization between a TX DAC 802 and a RX ADC 804, which may be in a UE, such as UE 102, or a base station, such as base station 110. Conventionally, TX DACs and RX ADCs use separate clocks for various reasons, including: power down savings, e.g., it is sometimes unnecessary for both TX and RX to be on during standby, use of variable sampling clocks for TX to avoid spurs; different phase noise requirements between TX DAC and RX ADC clocks, etc. As illustrated in FIG. 8, however, the TX DAC 802 and the RX ADC 804 both use the same digital reference clock 806. The TX DAC 802 receives the clock signal after it passes through a divider 808, which divides the sample clock by N and the RX ADC 804 receives the clock signal after it passes through a second divider 810, which divides the sample clock by M. The TX and RX sampling clock ratio (N/M) is a rational number. Using the same clock 806 for both the TX DAC 802 and the RX ADC 804, where the sampling clock ratio is a rational number (N/M) enables clock synchronization of the TX DAC 802 and the RX ADC 804 to prevent cycle slip errors, such as that shown in FIG. 4.

Figure 9:
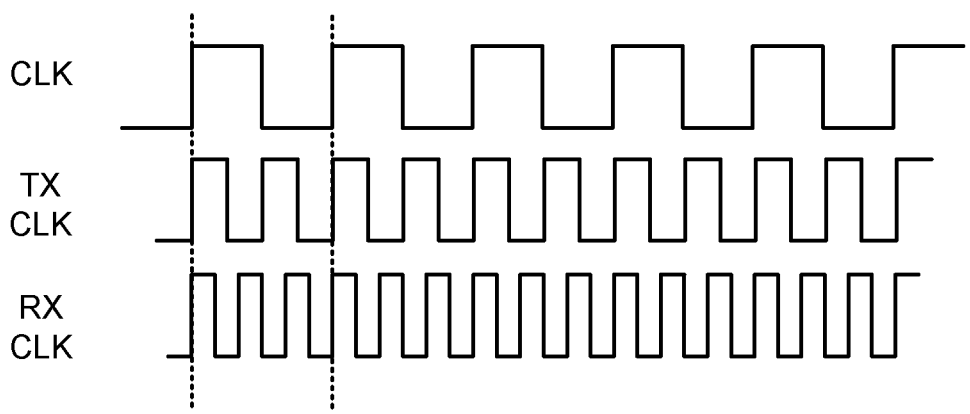
FIG. 9 illustrates a timing diagram showing a digital clock signal and sample clock signals received by a TX DAC and RX ADC.

FIG. 9, by way of example, illustrates a timing diagram showing a digital clock signal CLK, as well as the sample clock signal TX CLK received by the TX DAC 802 after the clock signal is divided by N by divider 808, where N=2, and the sample clock signal, RX CLK, received by the RX ADC 804 after the clock signal is divided by M by divider 808, where M=3. As it can be seen, with a sampling clock ratio (N/M=2/3) that is a rational number, for every 2 TX CLK cycles for the TX DAC 802, there are exactly 3 RX CLK cycles for the RX ADC 804, thereby avoiding cycle slip errors.

Figure 10:
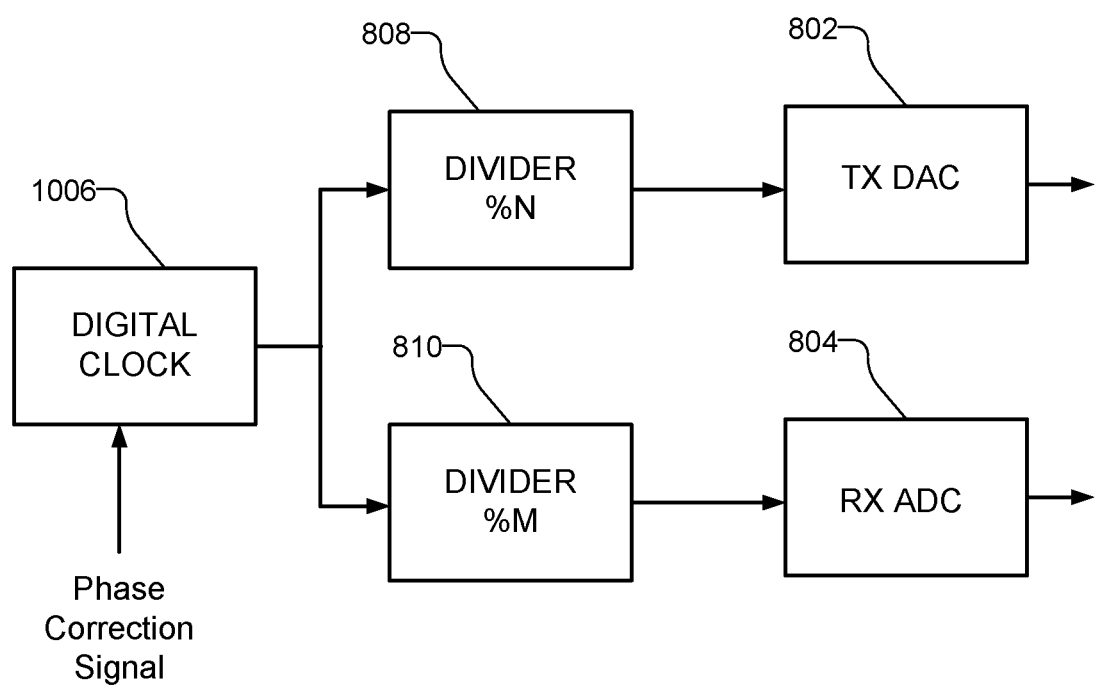
FIG. 10 is a block diagram illustrating synchronization between a TX DAC and a RX ADC using a clock signal from digital reference sampling clock that is controlled using the phase correction signal.

FIG. 10 is a block diagram illustrating another implementation of clock synchronization between the TX DAC 802 and the RX ADC 804. The system shown in FIG. 10 is similar to that shown in FIG. 8, like designated elements being the same. As shown in FIG. 10, however, the digital clock 1006 may receive the phase correction signal, e.g., from a phase match estimation circuit, such as those shown in FIGS. 6 and 7. The phase correction signal may control the digital clock 1006 so that the TX DAC 802 and the RX ADC 804 receive clock signals that are aligned with the TX VCO and RX VCO signals produced by TX PLL 704 and RX PLL 702 thereby eliminating another possible source of variable hardware delay.

Figure 11:
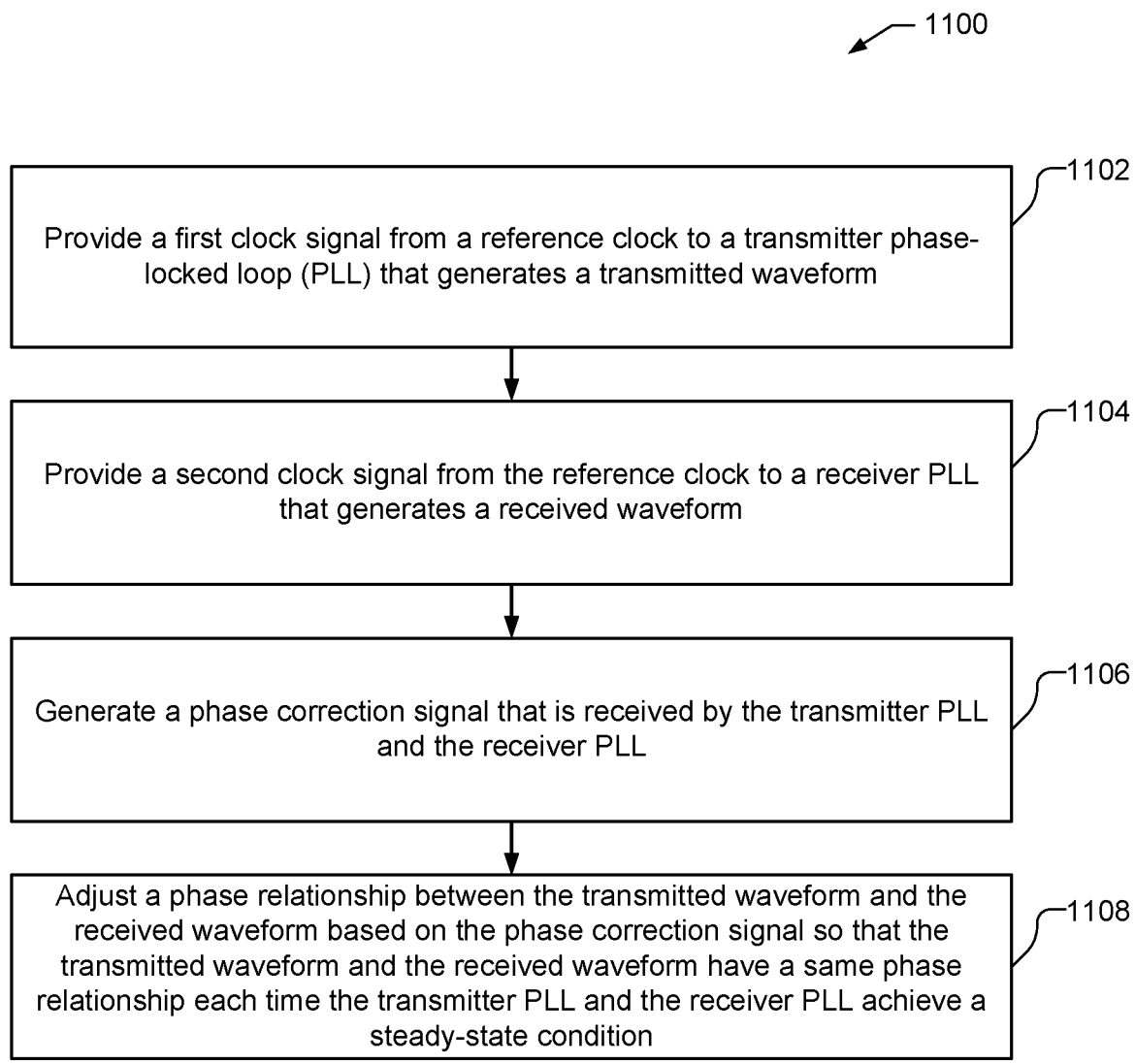
FIG. 11 illustrates an exemplary method of calibration of an entity in a wireless network.

FIG. 11 illustrates an exemplary method 1100 of calibration of an entity in a wireless network, the entity being one of a mobile device, such as UE 102, or base station, such as base station 110. As illustrated at block 1102, a first clock signal is provided from a reference clock to a transmitter (TX) phase-locked loop (PLL), e.g., TX PLL 704, that generates a TX waveform. At block 1104, a second clock signal is provided from the reference clock to a receiver (RX) PLL, e.g., RX PLL 702, that generates a RX waveform. At block 1106, a phase correction signal is generated that is received by the transmitter PLL and the receiver PLL. At block 1108, a phase relationship between the TX waveform and the RX waveform is adjusted based on the phase correction signal so that the TX waveform and the RX waveform have a same phase relationship each time the transmitter PLL and the receiver PLL achieve a steady-state condition.

In some implementations, the phase correction signal may be generated by receiving a third clock signal from the reference clock; receiving the TX waveform; receiving the RX waveform; determining a phase relationship between the TX waveform and RX waveform; and generating the phase correction signal based on the phase relationship between the TX waveform and the RX waveform.

In some implementations, the phase relationship between the TX waveform and the RX waveform is adjusted based on the phase correction signal by adjusting at least one of a transmitter loop filter or a transmitter ΣΔ modulator that controls a transmitter feedback divider in the transmitter PLL based on the phase correction signal to alter the phase delay in the TX waveform; and adjusting one of a receiver loop filter or a receiver ΣΔ modulator that controls a receiver feedback divider in the receiver PLL based on the phase correction signal to alter the phase delay in the RX waveform.

In some implementations, the method may further include providing a third clock signal from a digital reference sampling clock to a transmitter digital-to-analog converter; providing a fourth clock signal from the digital reference sampling clock to a receiver analog-to-digital converter; wherein a ratio of the third clock signal and the fourth clock signal is a rational number. For example, the method may further include generating the third clock signal by dividing a clock signal from the digital reference sampling clock by N, wherein N is an integer; and generating the fourth clock signal by dividing the clock signal from the digital reference sampling clock by M, wherein M is an integer, wherein the ratio N/M is a rational number. Further, the clock signal may be produced from the digital reference sampling clock based on the phase correction signal.

The methodologies described herein may be implemented by various means depending upon the application. For example, these methodologies may be implemented in hardware, firmware, software, or any combination thereof. For a hardware implementation, one or more processors may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For an implementation involving firmware and/or software, the methodologies may be implemented with modules (e.g., procedures, functions, and so on) that perform the separate functions described herein. Any machine-readable medium tangibly embodying instructions may be used in implementing the methodologies described herein. For example, software codes may be stored in a memory and executed by one or more processors, causing the one or more processors to operate as a special purpose computer programmed to perform the techniques disclosed herein. Memory may be implemented within the one or processors or external to the one or more processors. As used herein the term "memory" refers to any type of long term, short term, volatile, nonvolatile, or other memory and is not to be limited to any particular type of memory or number of memories, or type of media upon which memory is stored.

If implemented in firmware and/or software, the functions performed may be stored as one or more instructions or code on a non-transitory computer-readable storage medium. Examples of storage media include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage, semiconductor storage, or other storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable storage medium, instructions and/or data may be provided as signals on transmission media included in a communication apparatus. For example, an apparatus may include a transceiver having signals indicative of instructions and data. The instructions and data are stored on non-transitory computer readable media, e.g., memory, and are configured to cause the one or more processors to operate as a special purpose computer programmed to perform the techniques disclosed herein. That is, the communication apparatus includes transmission media with signals indicative of information to perform disclosed functions. At a first time, the transmission media included in the communication apparatus may include a first portion of the information to perform the disclosed functions, while at a second time the transmission media included in the communication apparatus may include a second portion of the information to perform the disclosed functions.

Thus, an entity in a wireless network, such as a mobile device or a base station may include a means for providing a first clock signal from a reference clock to a transmitter (TX) phase-locked loop (PLL) that generates a TX waveform, which may be, e.g., the reference clock 706 and the TX PLL 704, shown in FIG. 7. A means for providing a second clock signal from the reference clock to a receiver PLL that generates a RX waveform may be, e.g., the reference clock 706 and the RX PLL 702, shown in FIG. 7. A means for generating a phase correction signal that is received by the transmitter PLL and the receiver PLL may be, e.g., the phase match estimation circuit 600 shown in FIG. 6 or the phase match estimation circuit 708 shown in FIG. 7. A means for adjusting a phase relationship between the TX waveform and the RX waveform based on the phase correction signal so that the TX waveform and the RX waveform have a same phase relationship each time the transmitter PLL and the receiver PLL achieve a steady-state condition may be, e.g., digital loop filter 508 and/or the ΣΔ modulator 518 in a PLL 500 shown in FIG. 5.

In some implementations, the means for generating the phase correction signal may include a means for receiving a third clock signal from the reference clock, which may be, e.g., the reference clock (REFCLCK) shown in FIG. 6, a means for receiving the TX waveform, which may be, e.g., the Fs=Tx VCO in FIG. 6, a means for receiving the RX waveform, which may be, e.g., Fs=Rx VCO in FIG. 6, a means for determining a phase relationship between the TX waveform and RX waveform, which may be, e.g., the phase estimation circuit 620 in FIG. 6; and a means for generating the phase correction signal based on the phase relationship between the TX waveform and the RX waveform, which may be, e.g., the phase estimation circuit 620 in FIG. 6.

In some implementations, the means for adjusting the phase relationship between the TX waveform and the RX waveform based on the phase correction signal may include a means for adjusting at least one of a transmitter loop filter or a transmitter ΣΔ modulator that controls a transmitter feedback divider in the transmitter PLL based on the phase correction signal to alter a phase delay in the TX waveform, which may be, e.g., the phase correction signal input of the digital loop filter 508 and/or the ΣΔ modulator 518 in the PLL 500 shown in FIG. 5; and a means for adjusting one of a receiver loop filter or a receiver ΣΔ modulator that controls a receiver feedback divider in the receiver PLL based on the phase correction signal to alter a phase delay in the RX waveform, which may be, e.g., the phase correction signal input of the digital loop filter 508 and/or the ΣΔ modulator 518 in the PLL 500 shown in FIG. 5.

In some implementations, the entity may further include a means for providing a fourth clock signal from a digital reference sampling clock to a transmitter digital-to-analog converter, which may be, e.g., the connection between digital clock 806 and TX DAC 802 shown in FIG. 8. A means for providing a fifth clock signal from the digital reference sampling clock to a receiver analog-to-digital converter may be, e.g., the connection between digital clock 806 and RX ADC 804 shown in FIG. 8. The ratio of the fourth clock signal and the fifth clock signal may be a rational number. In one implementation, the entity may further include a means for generating the fourth clock signal by dividing a clock signal from the digital reference sampling clock by N, wherein N is an integer, which may be, e.g., the divider 808 shown in FIG. 8, and a means for generating the fifth clock signal by dividing the clock signal from the digital reference sampling clock by M, wherein M is an integer, wherein a ratio N/M is a rational number, which may be, e.g., the divider 808 shown in FIG. 8.

In one implementation, the entity may further include a means for producing the clock signal from the digital reference sampling clock based on the phase correction signal, which may be, e.g., the phase correction signal input to the digital clock 1006 shown in FIG. 10. While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An entity in a wireless network, the entity being one of a mobile device or base station, the entity comprising:
   a transmitter (TX) phase-locked loop (PLL) configured to receive a first clock signal from a reference clock and generate a TX waveform;
   a receiver (RX) phase-locked loop (PLL) configured to receive a second clock signal from the reference clock and generate a RX waveform;
   wherein one or both of the transmitter PLL and the receiver PLL is configured to receive a phase correction signal and to adjust a phase relationship between the TX waveform and the RX waveform based on the phase correction signal so that the TX waveform and the RX waveform have a same phase relationship each time the transmitter PLL and the receiver PLL achieve a steady-state condition.

2. The entity of claim 1, further comprising:
   a phase match estimation circuit configured to receive a third clock signal from the reference clock, the TX waveform, the RX waveform, the phase match estimation circuit configured to determine a phase relationship between the TX waveform and the RX waveform and to generate the phase correction signal to produce the phase relationship between the reference clock and the TX waveform.

3. The entity of claim 1, wherein one of a transmitter loop filter or a transmitter ΣΔ modulator that controls a transmitter feedback divider in the transmitter PLL is configured to receive the phase correction signal and adjust a phase delay in the TX waveform, and wherein one of a receiver loop filter or a receiver ΣΔ modulator that controls a receiver feedback divider in the receiver PLL is configured to receive the phase correction signal and adjust a phase delay in the RX waveform.

4. The entity of claim 1, further comprising:
   a transmitter digital-to-analog converter configured to receive a third clock signal from a digital reference sampling clock;
   a receiver analog-to-digital converter configured to receive a fourth clock signal from the digital reference sampling clock;
   wherein a ratio of the first clock signal and the second clock signal is a rational number.

5. The entity of claim 4, further comprising:
   a first frequency divider coupled to the digital reference sampling clock that divides a clock signal from the digital reference sampling clock by N, wherein N is an integer, to produce the third clock signal received by the transmitter digital-to-analog converter; and
   a second frequency divider coupled to the digital reference sampling clock that divides the clock signal from the digital reference sampling clock by M, wherein M is an integer, to produce the fourth clock signal received by the receiver analog-to-digital converter, wherein a ratio N/M is a rational number.

6. The entity of claim 4, wherein the digital clock is configured to receive the phase correction signal and produce a digital clock signal based on the phase correction signal.

7. A method of calibration of an entity in a wireless network, the entity being one of a mobile device or base station, the method comprising:
   providing a first clock signal from a reference clock to a transmitter (TX) phase-locked loop (PLL) that generates a TX waveform;
   providing a second clock signal from the reference clock to a receiver (RX) PLL that generates a RX waveform;
   generating a phase correction signal that is received by the transmitter PLL and the receiver PLL; and
   adjusting a phase relationship between the TX waveform and the RX waveform based on the phase correction signal so that the TX waveform and the RX waveform have a same phase relationship each time the transmitter PLL and the receiver PLL achieve a steady-state condition.

8. The method of claim 7, wherein generating the phase correction signal comprises:
   receiving a third clock signal from the reference clock;
   receiving the TX waveform;
   receiving the RX waveform;
   determining a phase relationship between the TX waveform and the RX waveform; and generating the phase correction signal based on the phase relationship between the TX waveform and the RX waveform.

9. The method of claim 7, wherein adjusting the phase relationship between the TX waveform and the RX waveform based on the phase correction signal comprises:
adjusting at least one of a transmitter loop filter or a transmitter ΣΔ modulator that controls a transmitter feedback divider in the transmitter PLL based on the phase correction signal to alter a phase delay in the TX waveform; and
adjusting one of a receiver loop filter or a receiver ΣΔ modulator that controls a receiver feedback divider in the receiver PLL based on the phase correction signal to alter a phase delay in the RX waveform.

10. The method of claim 7, further comprising:
providing a third clock signal from a digital reference sampling clock to a transmitter digital-to-analog converter;
providing a fourth clock signal from the digital reference sampling clock to a receiver analog-to-digital converter;
wherein a ratio of the third clock signal and the fourth clock signal is a rational number.

11. The method of claim 10, further comprising:
generating the third clock signal by dividing a clock signal from the digital reference sampling clock by N, wherein N is an integer; and
generating the fourth clock signal by dividing the clock signal from the digital reference sampling clock by M, wherein M is an integer, wherein a ratio N/M is a rational number.

12. The method of claim 10, further comprising producing the clock signal from the digital reference sampling clock based on the phase correction signal.

13. An entity in a wireless network, the entity being one of a mobile device or base station, the entity comprising:
means for providing a first clock signal from a reference clock to a transmitter (TX) phase-locked loop (PLL) that generates a TX waveform;
means for providing a second clock signal from the reference clock to a receiver (RX) PLL that generates a RX waveform;
means for generating a phase correction signal that is received by the transmitter PLL and the receiver PLL; and
means for adjusting a phase relationship between the TX waveform and the RX waveform based on the phase correction signal so that the TX waveform and the RX waveform have a same phase relationship each time the transmitter PLL and the receiver PLL achieve a steady-state condition.

14. The entity of claim 13, wherein the means for generating the phase correction signal comprises:
means for receiving a third clock signal from the reference clock;
means for receiving the TX waveform;
means for receiving the RX waveform;
means for determining a phase relationship between the TX waveform and the RX waveform; and
means for generating the phase correction signal based on the phase relationship between the TX waveform and the RX waveform.

15. The entity of claim 13, wherein the means for adjusting the phase relationship between the TX waveform and the RX waveform based on the phase correction signal comprises:
means for adjusting at least one of a transmitter loop filter or a transmitter ΣΔ modulator that controls a transmitter feedback divider in the transmitter PLL based on the phase correction signal to alter a phase delay in the TX waveform; and
means for adjusting one of a receiver loop filter or a receiver ΣΔ modulator that controls a receiver feedback divider in the receiver PLL based on the phase correction signal to alter a phase delay in the RX waveform.

16. The entity of claim 13, further comprising:
means for providing a third clock signal from a digital reference sampling clock to a transmitter digital-to-analog converter;
means for providing a fourth clock signal from the digital reference sampling clock to a receiver analog-to-digital converter;
wherein a ratio of the third clock signal and the fourth clock signal is a rational number.

17. The entity of claim 16, further comprising:
means for generating the third clock signal by dividing a clock signal from the digital reference sampling clock by N, wherein N is an integer; and
means for generating the fourth clock signal by dividing the clock signal from the digital reference sampling clock by M, wherein M is an integer, wherein a ratio N/M is a rational number.

18. The entity of claim 16, further comprising means for producing the clock signal from the digital reference sampling clock based on the phase correction signal.

19. A non-transitory storage medium including program code stored thereon, the program code is operable to control at least one processor in an entity in a wireless network, the entity being one of a mobile device or base station comprising:
wherein a first clock signal is provided from a reference clock to a transmitter (TX) phase-locked loop (PLL) that generates a TX waveform and a second clock signal is provided from the reference clock to a receiver (RX) PLL that generates a RX waveform;
program code to generate a phase correction signal that is received by the transmitter PLL and the receiver PLL; and
program code to adjust a phase relationship between the TX waveform and the RX waveform based on the phase correction signal so that the TX waveform and the RX waveform have a same phase relationship each time the transmitter PLL and the receiver PLL achieve a steady-state condition.

20. The non-transitory storage medium of claim 19, wherein the program code to generate the phase correction signal comprises:
program code to receive a third clock signal from the reference clock;
program code to receive the TX waveform;
program code to receive the RX waveform;
program code to determine a phase relationship between the TX waveform and the RX waveform; and
program code to generate the phase correction signal based on the phase relationship between the TX waveform and the RX waveform.

21. The non-transitory storage medium of claim 19, wherein the program code to adjust the phase relationship between the TX waveform and the RX waveform based on the phase correction signal comprises:
program code to adjust at least one of a transmitter loop filter or a transmitter ΣΔ modulator that controls a transmitter feedback divider in the transmitter PLL based on the phase correction signal to alter a phase delay in the TX waveform; and program code to adjust one of a receiver loop filter or a receiver ΣΔ modulator that controls a receiver feedback divider in the receiver PLL based on the phase correction signal to alter a phase delay in the RX waveform.

22. The non-transitory storage medium of claim 19, further comprising:

program code to providing a third clock signal from a digital reference sampling clock to a transmitter digital-to-analog converter;

program code to providing a fourth clock signal from the digital reference sampling clock to a receiver analog-to-digital converter;

wherein a ratio of the third clock signal and the fourth clock signal is a rational number.

23. The non-transitory storage medium of claim 22, further comprising:

program code to generate the third clock signal by dividing a clock signal from the digital reference sampling clock by N, wherein N is an integer; and program code to generate the fourth clock signal by dividing the clock signal from the digital reference sampling clock by M, wherein M is an integer, wherein a ratio N/M is a rational number.

24. The non-transitory storage medium of claim 22, further comprising program code to produce the clock signal from the digital reference sampling clock based on the phase correction signal.

\* \* \* \* \*